(12) United States Patent
Morita (10) Patent No.: US 9,444,351 B2
(45) Date of Patent: Sep. 13, 2016

(54) ELECTRICAL POWER CONVERSION DEVICE INCLUDING NORMALLY-OFF BIDIRECTIONAL SWITCH

(71) Applicant: PANASONIC CORPORATION, Osaka (JP)

(72) Inventor: Tatsuo Morita, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 231 days.

(21) Appl. No.: 14/192,803

(22) Filed: Feb. 27, 2014

(65) Prior Publication Data

US 2014/0177308 A1 Jun. 26, 2014

Related U.S. Application Data

(63) Continuation of application No. PCT/JP2012/003944, filed on Jun. 15, 2012.

(30) Foreign Application Priority Data

Aug. 30, 2011 (JP) ................................ 2011-187155

(51) Int. Cl.
*H02M 3/335* (2006.01)
*H02M 1/08* (2006.01)
*H03K 17/687* (2006.01)

(52) U.S. Cl.
CPC ........... *H02M 3/33507* (2013.01); *H02M 1/08* (2013.01); *H02M 3/33523* (2013.01); *H03K 17/687* (2013.01); *H03K 2017/6878* (2013.01); *H03K 2217/0045* (2013.01); *H03K 2217/0081* (2013.01)

(58) Field of Classification Search
CPC H02M 3/33507; H02M 1/08; H03K 17/687; H03K 2217/0045; H03K 2017/6878
USPC .................... 363/21.01–21.18, 127, 142, 145
See application file for complete search history.

(56) References Cited

U.S. PATENT DOCUMENTS

| 4,260,943 A | * | 4/1981 | Zaderej | H02J 7/022 320/140 |
|---|---|---|---|---|
| 2002/0009980 A1 | | 1/2002 | Katakura et al. | |

(Continued)

FOREIGN PATENT DOCUMENTS

| EP | 2 309 633 A1 | 4/2011 |
|---|---|---|
| JP | S52-138637 | 11/1977 |
| JP | 2001-320243 A | 11/2001 |
| JP | 2003-134825 A | 5/2003 |
| JP | 2007-028894 A | 2/2007 |

(Continued)

OTHER PUBLICATIONS

International Search Report issued in International Application No. PCT/JP2012/003944 with Date of mailing Sep. 18, 2012, with English Translation.

*Primary Examiner* — Yemane Mehari
(74) *Attorney, Agent, or Firm* — McDermott Will & Emery LLP (57) ABSTRACT

A normally-off bidirectional switch having two gates is connected to a transformer. The transformer has a first winding and a second winding. A first gate bias power supply configured to use power generated at the first winding to supply power for driving one of the gates of the bidirectional switch and a second gate bias power supply configured to use power generated at the second winding to supply power for driving the other gate of the bidirectional switch are provided.

8 Claims, 11 Drawing Sheets

(56) References Cited

U.S. PATENT DOCUMENTS

| | | | |
|---|---|---|---|
| 2007/0008747 A1* | 1/2007 | Soldano | H02M 7/217 363/21.04 |
| 2010/0097105 A1 | 4/2010 | Morita et al. | |
| 2010/0135053 A1* | 6/2010 | Morimoto | H02M 7/219 363/127 |

FOREIGN PATENT DOCUMENTS

| | | |
|---|---|---|
| JP | 2008-178200 A | 7/2008 |
| JP | 2009-148106 A | 7/2009 |
| JP | 2011-101217 A | 5/2011 |
| WO | 2008/062800 A1 | 5/2008 |
| WO | 2010/010711 A1 | 1/2010 |

* cited by examiner

|  | Vg1 | Vg2 | STATE |
|---|---|---|---|
| FIRST OPERATION MODE | 5V | 5V | S1 —o o— S2 |
| SECOND OPERATION MODE | 0V | 0V | S1 —o o— S2 |
| THIRD OPERATION MODE | 5V | 0V | S1 ◀— S2 |
| FOURTH OPERATION MODE | 0V | 5V | S1 —▶ S2 |

ELECTRICAL POWER CONVERSION DEVICE INCLUDING NORMALLY-OFF BIDIRECTIONAL SWITCH

CROSS-REFERENCE TO RELATED APPLICATIONS

This is a continuation of International Application No. PCT/JP2012/003944 filed on Jun. 15, 2012, which claims priority to Japanese Patent Application No. 2011-187155 filed on Aug. 30, 2011. The entire disclosures of these applications are incorporated by reference herein.

BACKGROUND

The present disclosure relates to a power conversion device such as an AC/DC power supply.

In order to reduce power consumption of electronic equipment, there is a need to increase the efficiency of power conversion devices such as power supplies. For example, in a so-called "AC/DC power supply" configured to convert AC power to DC power, power conversion is performed in such a manner that AC power is converted into DC power in a diode rectifier and then the DC power is converted into desired voltage in a DC/DC converter. However, since a power conversion loss is caused in the diode rectifier and the DC/DC converter, it is important for higher efficiency of the power supply to reduce the power conversion loss in the diode rectifier and the DC/DC converter.

A diode rectifier-less power supply including a bidirectional switch has been proposed as a circuit configured to reduce a loss caused in a diode rectifier (see Japanese Unexamined Patent Publication No. 2007-028894). The loss caused in the diode rectifier has been eliminated, and the efficiency of an AC/DC power supply can be increased. However, since a normally-on bidirectional switch causing current to flow at a gate voltage of 0 V is used, there is a possibility that current cannot be interrupted at an abnormal state of a gate circuit and therefore a power supply circuit is damaged.

On the other hand, a normally-off bidirectional switch capable of interrupting current at a gate voltage of 0 V has been known (see International Patent Publication No. WO 2008/062800 and Japanese Unexamined Patent Publication No. 2009-148106).

SUMMARY

The power conversion device described in Japanese Unexamined Patent Publication No. 2007-028894 is configured to drive the normally-on bidirectional switch. Even if a normally-off bidirectional switch is employed for such a power conversion device, the normally-off bidirectional switch cannot be driven.

The present disclosure has been made in view of the foregoing, and aims to use a normally-off bidirectional switch to provide a power conversion device with higher safety and higher efficiency.

In order to accomplish the foregoing aim, a power conversion device of the present disclosure includes a transformer; a first normally-off bidirectional switch including two gates and connected to the transformer; a first controller configured to control the first normally-off bidirectional switch; and a gate power supply circuit configured to generate power to be supplied from an AC power supply to the gates of the first normally-off bidirectional switch.

More specifically, the transformer includes a first winding and a second winding, and the gate power supply circuit includes a first gate bias power supply configured to use power generated at the first winding to supply power for driving one of the gates of the first normally-off bidirectional switch, and a second gate bias power supply configured to use power generated at the second winding to supply power for driving the other gate of the first normally-off bidirectional switch.

According to the present disclosure, a normally-off bidirectional switch is used to provide a power conversion device with higher safety and higher efficiency.

DETAILED DESCRIPTION

Embodiments of the present disclosure will be described below in detail with reference to drawings.

First Embodiment

Figure 1:
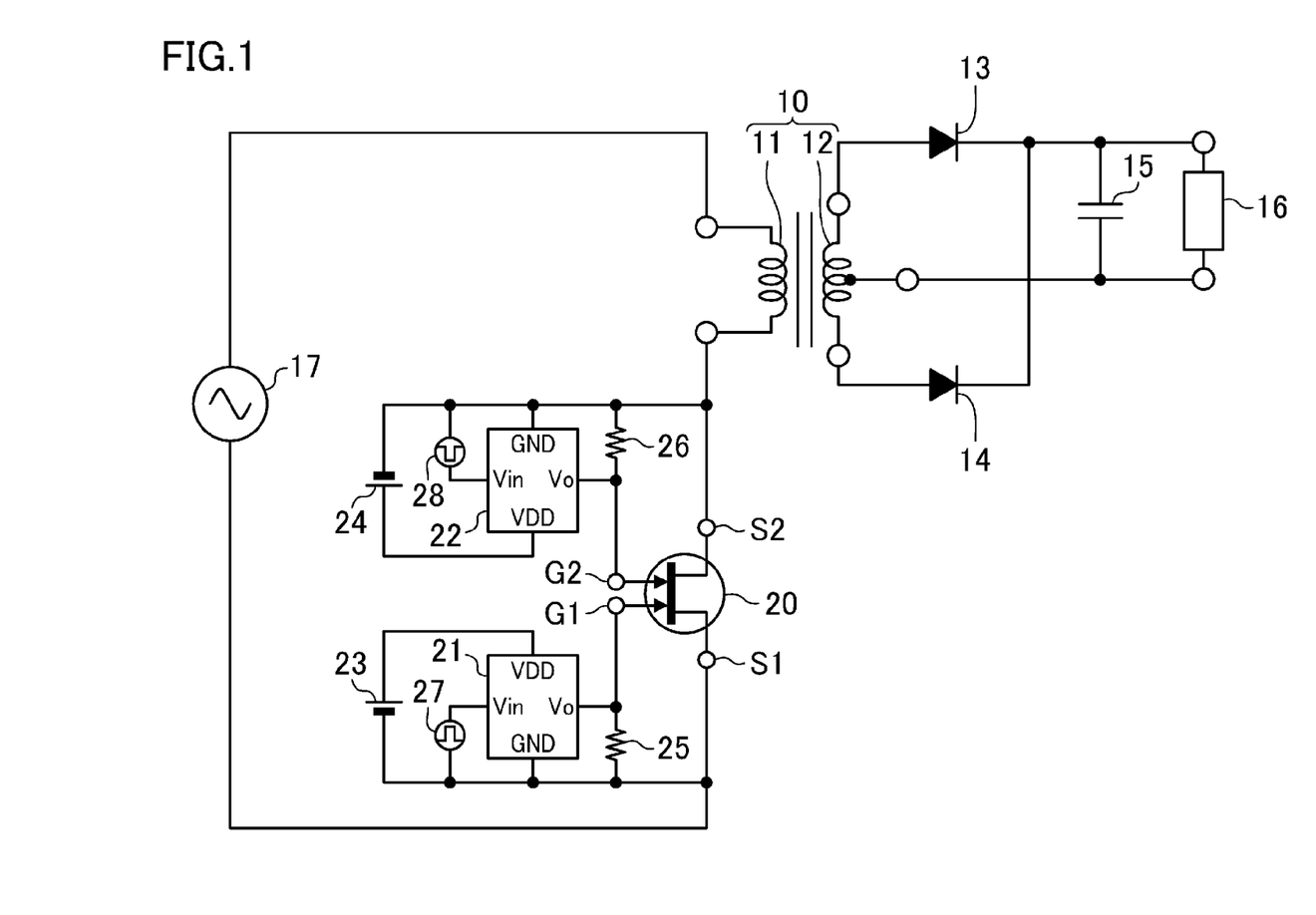
FIG. 1 is a circuit diagram illustrating a configuration of a power conversion device of a first embodiment of the present disclosure.

FIG. 1 is a circuit diagram illustrating a first embodiment of a power conversion device using a bidirectional switch. The power conversion device illustrated in FIG. 1 includes a transformer 10, a first diode 13, a second diode 14, a capacitor 15, a bidirectional switch 20, a first gate circuit 21, a second gate circuit 22, a first gate bias power supply 23, a second gate bias power supply 24, a first resistor 25, and a second resistor 26. A signal is input from a first control signal source 27 to the first gate circuit 21, and a signal is input from a second control signal source 28 to the second gate circuit 22. Then, the bidirectional switch 20 is switched to perform power conversion.

The bidirectional switch 20 described herein is a switch withstanding at least positive and negative applied voltage and being capable of switching current between two directions. In the present embodiment, the example where the bidirectional switch 20 which is, as described in International Patent Publication No. WO 2008/062800, capable of performing a normally-off operation and which includes two gates is used will be described. The bidirectional switch 20 includes an S1 terminal serving as a first source electrode, an S2 terminal serving as a second source electrode, a G1 terminal serving as a first gate electrode, and a G2 terminal serving as a second gate electrode.

The transformer 10 includes a first winding 11 and a second winding 12. One of terminals of the first winding 11 is connected to an AC power supply 17, and the other terminal of the first winding 11 is connected to the S2 terminal of the bidirectional switch 20. The second winding 12 has three terminals. A first one of the terminals of the second winding 12 is connected to an anode of the first diode 13, and a second one of the terminals of the second winding 12 is connected to an anode of the second diode 14. A third one of the terminals of the second winding 12 at a middle tap thereof is connected to one of terminals of the capacitor 15 and a load 16. The other terminal of the capacitor 15 is connected to a cathode of the first diode 13, a cathode of the second diode 14, and the load 16.

The S1 terminal of the bidirectional switch 20 is connected to the AC power supply 17. The G1 terminal of the bidirectional switch 20 is connected to a Vo terminal of the first gate circuit 21. The G2 terminal of the bidirectional switch 20 is connected to a Vo terminal of the second gate circuit 22.

A VDD terminal of the first gate circuit 21 is connected to a positive terminal of the first gate bias power supply 23. A GND terminal of the first gate circuit 21 is connected to the S1 terminal of the bidirectional switch 20 and a negative terminal of the first gate bias power supply 23.

A VDD terminal of the second gate circuit 22 is connected to a positive terminal of the second gate bias power supply 24. A GND terminal of the second gate circuit 22 is connected to the S2 terminal of the bidirectional switch 20 and a negative terminal of the second gate bias power supply 24.

The first resistor 25 is connected between the S1 terminal and the G1 terminal of the bidirectional switch 20. Even if the first gate circuit 21 is not operated, the first resistor 25 maintains control voltage between the G1 terminal and the S1 terminal at 0 V, and interrupts current flowing from the S2 terminal to the S1 terminal. Thus, damage of the power conversion device can be prevented.

The second resistor 26 is connected between the S2 terminal and the G2 terminal of the bidirectional switch 20. Even if the second gate circuit 22 is not operated, the second resistor 26 maintains control voltage between the G2 terminal and the S2 terminal at 0 V, and interrupts current flowing from the S1 terminal to the S2 terminal. Thus, damage of the power conversion device can be prevented.

When, e.g., a signal of 0 V indicating logical "Low" is input to a Vin terminal of the gate circuit 21 or 22, the gate circuit 21 or 22 is operated such that the Vo terminal and the GND terminal are electrically connected together and that the Vo terminal and the VDD terminal are electrically disconnected from each other. When, e.g., a signal of 5 V indicating logical "High" is input to the Vin terminal of the gate circuit 21 or 22, the gate circuit 21 or 22 is operated such that the Vo terminal and the VDD terminal are electrically connected together and that the Vo terminal and the GND terminal are electrically disconnected from each other.

Figure 2A:
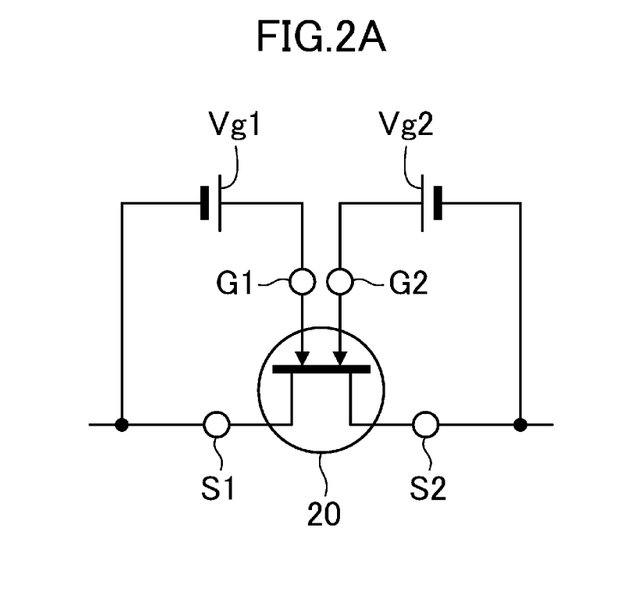
FIG. 2A is a diagram illustrating a method for gate biasing of a bidirectional switch illustrated in FIG. 1.
Figure 2B:
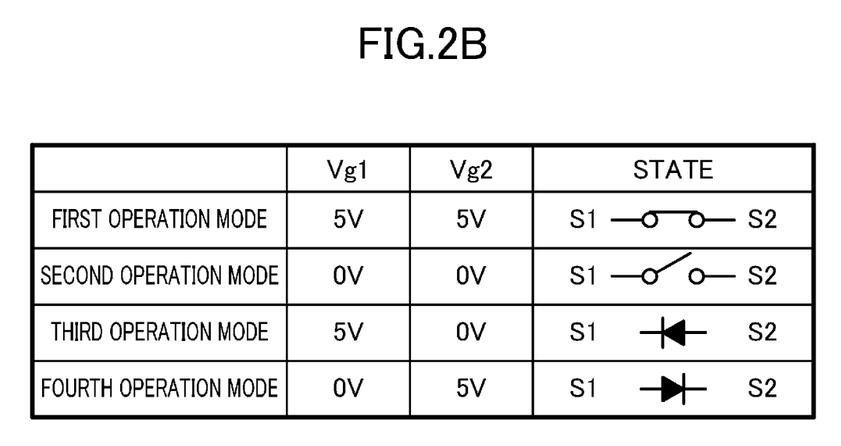
FIG. 2B is a table illustrating four operation modes of the bidirectional switch.

FIG. 2A is a diagram illustrating a gate biasing method for the bidirectional switch 20 used for the present embodiment. The bidirectional switch 20 is capable of providing, for four drive conditions illustrated in FIG. 2B, four operation modes using a power supply Vg1 connected between the S1 terminal and the G1 terminal and a power supply Vg2 connected between the S2 terminal and the G2 terminal. If each of the power supplies Vg1 and Vg2 outputs voltage (e.g., a voltage of 5 V) higher than gate threshold voltage of the bidirectional switch 20, the bidirectional switch 20 is in a first operation mode in which current flows between the S1 terminal and the S2 terminal in both directions. In this case, since current-voltage characteristics show no offset, current can flow with lower on-resistance. If each of the power supplies Vg1 and Vg2 outputs voltage (e.g., a voltage of 0 V) lower than the gate threshold voltage of the bidirectional switch 20, the bidirectional switch 20 is in a second operation mode in which current in both directions is interrupted between the S1 terminal and the S2 terminal. Moreover, if the power supply Vg1 outputs voltage (e.g., a voltage of 5 V) higher than the gate threshold voltage, and the power supply Vg2 outputs voltage (e.g., a voltage of 0 V) lower than the gate threshold voltage, the bidirectional switch 20 is in a third operation mode in which current flows, as in a diode, from the S2 terminal to the S1 terminal and current from the S1 terminal to the S2 terminal is interrupted. Further, if the power supply Vg2 outputs voltage (e.g., a voltage of 5 V) higher than the gate threshold voltage, and the power supply Vg1 outputs voltage (e.g., a voltage of 0 V) lower than the gate threshold voltage, the bidirectional switch 20 is in a fourth operation mode in which current flows, as in a diode, from the S1 terminal to the S2 terminal and current from the S2 terminal to the S1 terminal is interrupted.

The power conversion device having the foregoing configuration is operated as follows to convert AC power to DC power.

If the potential of one of terminals of the AC power supply 17 connected to the transformer 10 is higher than that of the other terminal of the AC power supply 17, a pulse width modulation (PWM) signal is input to the Vin terminal of the first gate circuit 21 to switch current flowing from the S2 terminal to S1 terminal of the bidirectional switch 20 through the transformer 10. Then, power is transmitted to the second winding 12 through the transformer 10. In such a state, it is preferred that, in order to cause the bidirectional switch 20 to allow current to flow with lower on-resistance, a High signal is input to the Vin terminal of the second gate circuit 22 and, e.g., a voltage of 5 V is applied to the G2 terminal of the bidirectional switch 20. Note that the power conversion device is operated even if a Low signal is input to the Vin terminal of the second gate circuit 22.

If the potential of one of the terminals of the AC power supply 17 connected to the transformer 10 is lower than that of the other terminal of the AC power supply 17, a PWM signal is input to the Vin terminal of the second gate circuit 22 to switch current flowing from the S1 terminal of the bidirectional switch 20 to the transformer 10 through the S2 terminal of the bidirectional switch 20. Then, power is transmitted to the second winding 12 through the transformer 10. In such a state, it is preferred that, in order to cause the bidirectional switch 20 to allow current to flow with lower on-resistance, a High signal is input to the Vin terminal of the first gate circuit 21 and, e.g., a voltage of 5 V is applied to the G1 terminal of the bidirectional switch 20. Note that the power conversion device is operated even if a Low signal is input to the Vin terminal of the first gate circuit 21.

Power generated at the second winding 12 is rectified into DC power by the first diode 13 and the second diode 14, and then is smoothed by the capacitor 15. As a result, such power can be converted into stable DC power.

If AC power generated at the second winding 12 of the transformer 10 is used as it is, the first diode 13, the second diode 14, and the capacitor 15 are not necessarily used.

Although power for the first gate bias power supply 23 and the second gate bias power supply 24 may be supplied from the outside, a circuit configured to generate power from the AC power supply 17 will be described below.

Second Embodiment

Figure 3:
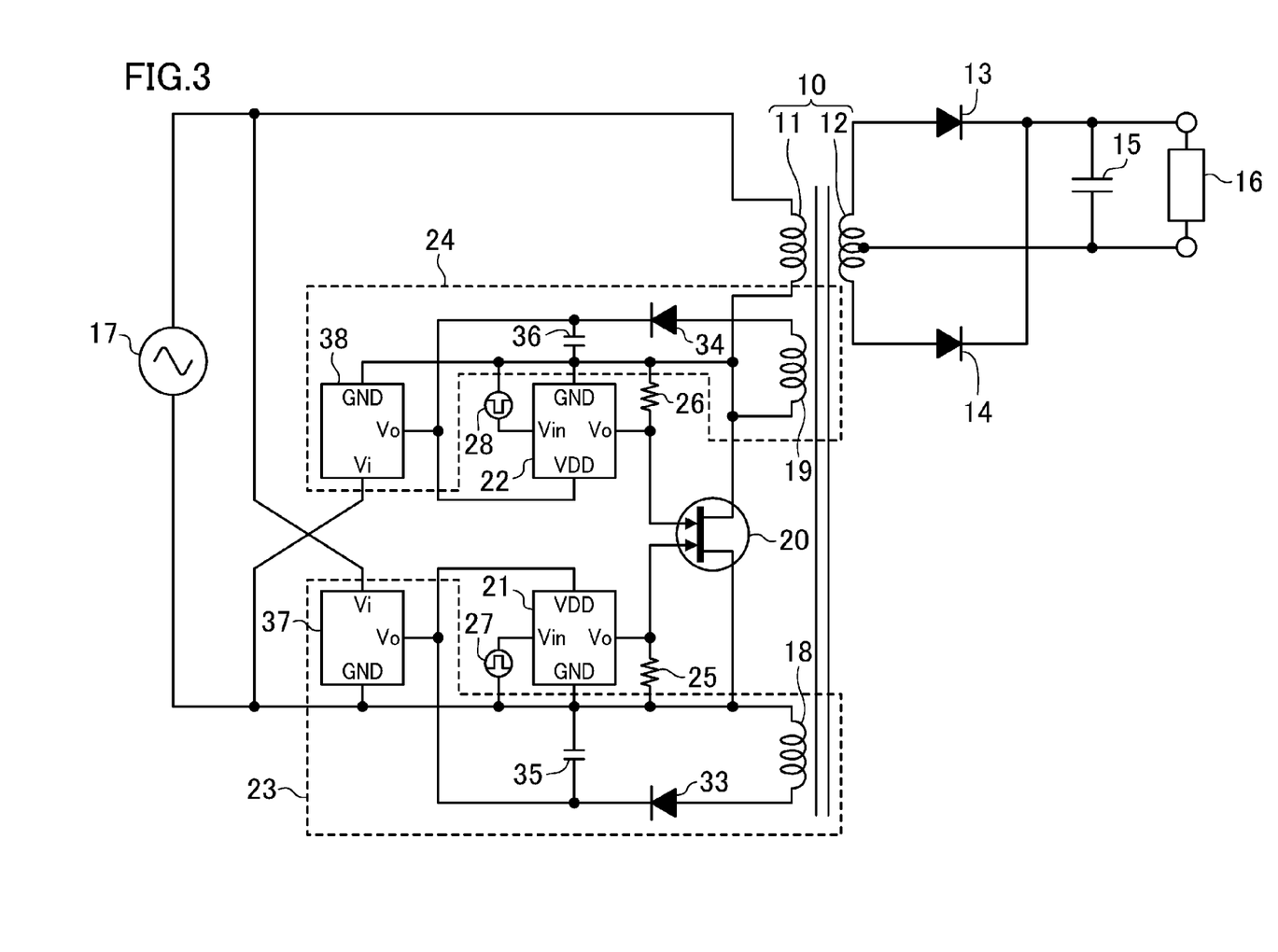
FIG. 3 is a circuit diagram illustrating a configuration of a power conversion device of a second embodiment of the present disclosure.

FIG. 3 is a circuit diagram of a power conversion device of a second embodiment. In the second embodiment, power for the first gate bias power supply 23 and the second gate bias power supply 24 of the first embodiment is obtained from an AC power supply 17.

The first gate bias power supply 23 includes a first winding 18 provided in a transformer 10, a third diode 33, a second capacitor 35, and a first auxiliary power circuit 37. One of terminals of the first winding 18 is connected to an S1 terminal of a bidirectional switch 20, and the other terminal of the first winding 18 is connected to an anode of the third diode 33. A cathode of the third diode 33 is connected to a Vo terminal of the first auxiliary power circuit 37 and a VDD terminal of a first gate circuit 21. One of terminals of the second capacitor 35 is connected to the VDD terminal of the first gate circuit 21, and the other terminal of the second capacitor 35 is connected to a GND terminal of the first gate circuit 21. A GND terminal of the first auxiliary power circuit 37 is connected to the S1 terminal of the bidirectional switch 20, and a Vi terminal of the first auxiliary power circuit 37 is connected to a line connecting between the transformer 10 and the AC power supply 17.

The second gate bias power supply 24 includes a second winding 19 provided in the transformer 10, a fourth diode 34, a third capacitor 36, and a second auxiliary power circuit 38. One of terminals of the second winding 19 is connected to an S2 terminal of the bidirectional switch 20, and the other terminal of the second winding 19 is connected to an anode of the fourth diode 34. A cathode of the fourth diode 34 is connected to a Vo terminal of the second auxiliary power circuit 38 and a VDD terminal of a second gate circuit 22. One of terminals of the third capacitor 36 is connected to the VDD terminal of the second gate circuit 22, and the other terminal of the third capacitor 36 is connected to a GND terminal of the second gate circuit 22. A GND terminal of the second auxiliary power circuit 38 is connected to the S2 terminal of the bidirectional switch 20, and a Vi terminal of the second auxiliary power circuit 38 is connected to a line connecting between the bidirectional switch 20 and the AC power supply 17.

According to such a configuration, power is transmitted from a first winding 11 not only to a second winding 12 but also to the first winding 18 and the second winding 19 during a switching operation of the bidirectional switch 20. For example, power generated at the first winding 18 is converted into DC power by the third diode 33, and then is smoothed by the second capacitor 35. Such power is supplied as power for driving the first gate circuit 21. Moreover, power for the second gate bias power supply 24 is generated in the similar manner.

While the switching operation of the bidirectional switch 20 is stopped, the first auxiliary power circuit 37 constantly supplies power in the first gate bias power supply 23. Similarly, the second auxiliary power circuit 38 constantly supplies power in the second gate bias power supply 24.

According to the foregoing configuration, a direct power supply from the AC power supply 17 to the first and second gate bias power supplies 23 and 24 is ensured.

Figure 4:
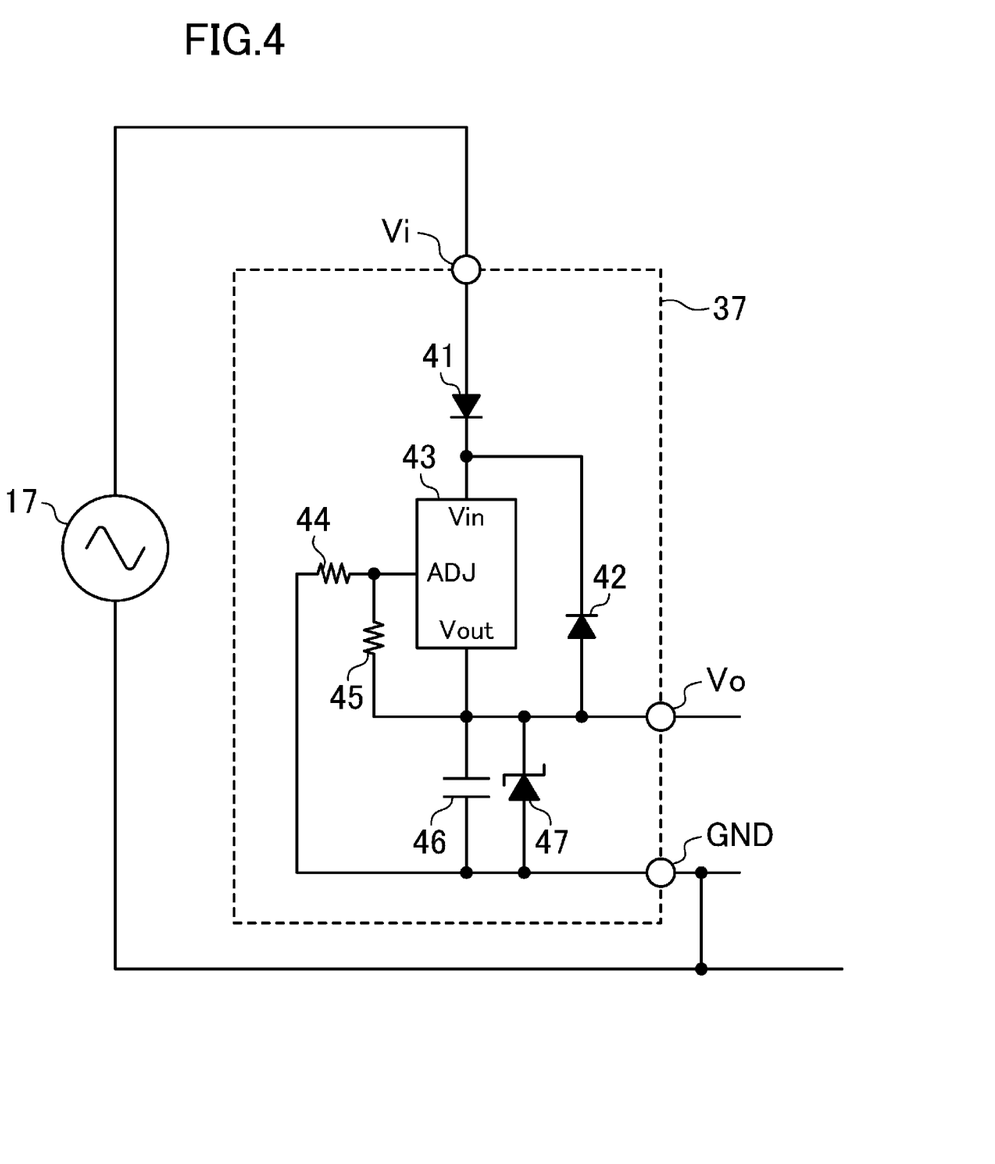
FIG. 4 is a circuit diagram illustrating a first example of an auxiliary power circuit illustrated in FIG. 3.

FIG. 4 illustrates a first example of the auxiliary power circuit 37 of the present embodiment. The auxiliary power circuit 37 of the first example includes a first diode 41, a second diode 42, a three-terminal regulator 43, a first setting resistor 44, a second setting resistor 45, a capacitor 46, and a zener diode 47. The auxiliary power circuit 37 further includes a Vi terminal, a Vo terminal, and a GND terminal. The Vi terminal is connected to an anode of the first diode 41. A cathode of the first diode 41 is connected to a Vin terminal of the three-terminal regulator 43. A Vout terminal of the three-terminal regulator 43 is connected to a cathode of the zener diode 47 and the Vo terminal. An ADJ terminal of the three-terminal regulator 43 is connected to an anode of the zener diode 47 and the GND terminal through the first setting resistor 44. One of terminals of the capacitor 46 is connected to the Vo terminal, and the other terminal of the capacitor 46 is connected to the GND terminal The second setting resistor 45 is connected between the Vout terminal and the ADJ terminal of the three-terminal regulator 43. A cathode of the second diode 42 is connected to the Vin terminal of the three-terminal regulator 43, and an anode of the second diode 42 is connected to the Vout terminal of the three-terminal regulator 43.

If the potential of the Vi terminal is higher than that of the GND terminal, voltage is applied from the AC power supply 17 to the three-terminal regulator 43 through the Vi terminal and the first diode 41. Such voltage is reduced to desired gate bias voltage by the three-terminal regulator 43. In this example, the voltage is reduced to, e.g., 5 V. In order to stabilize gate bias voltage, the capacitor 46 and the zener diode 47 are inserted in this example.

If the potential of the Vi terminal is lower than that of the GND terminal, voltage between the Vi terminal and the GND terminal is supported by the first diode 41, and the second diode 42 and the zener diode 47 prevent high reverse voltage from being applied to the three-terminal regulator 43 and the capacitor 46.

According to such a configuration, power can be supplied from the AC power supply 17 to the gate bias power supply 23. As long as desired output voltage is obtained, a diode may be, instead of the zener diode 47, provided such that reverse voltage is not applied to the capacitor 46.

If the three-terminal regulator 43 can set desired output power, the first setting resistor 44 and the second setting resistor 45 are not necessarily provided.

Even when voltage is applied between the Vout terminal and the Vin terminal of the three-terminal regulator 43 such that the potential of the Vin terminal is higher than that of the Vout terminal, if the power conversion device is normally operated without damaging the three-terminal regulator 43, the first diode 41 and the second diode 42 are not necessarily provided.

Figure 5:
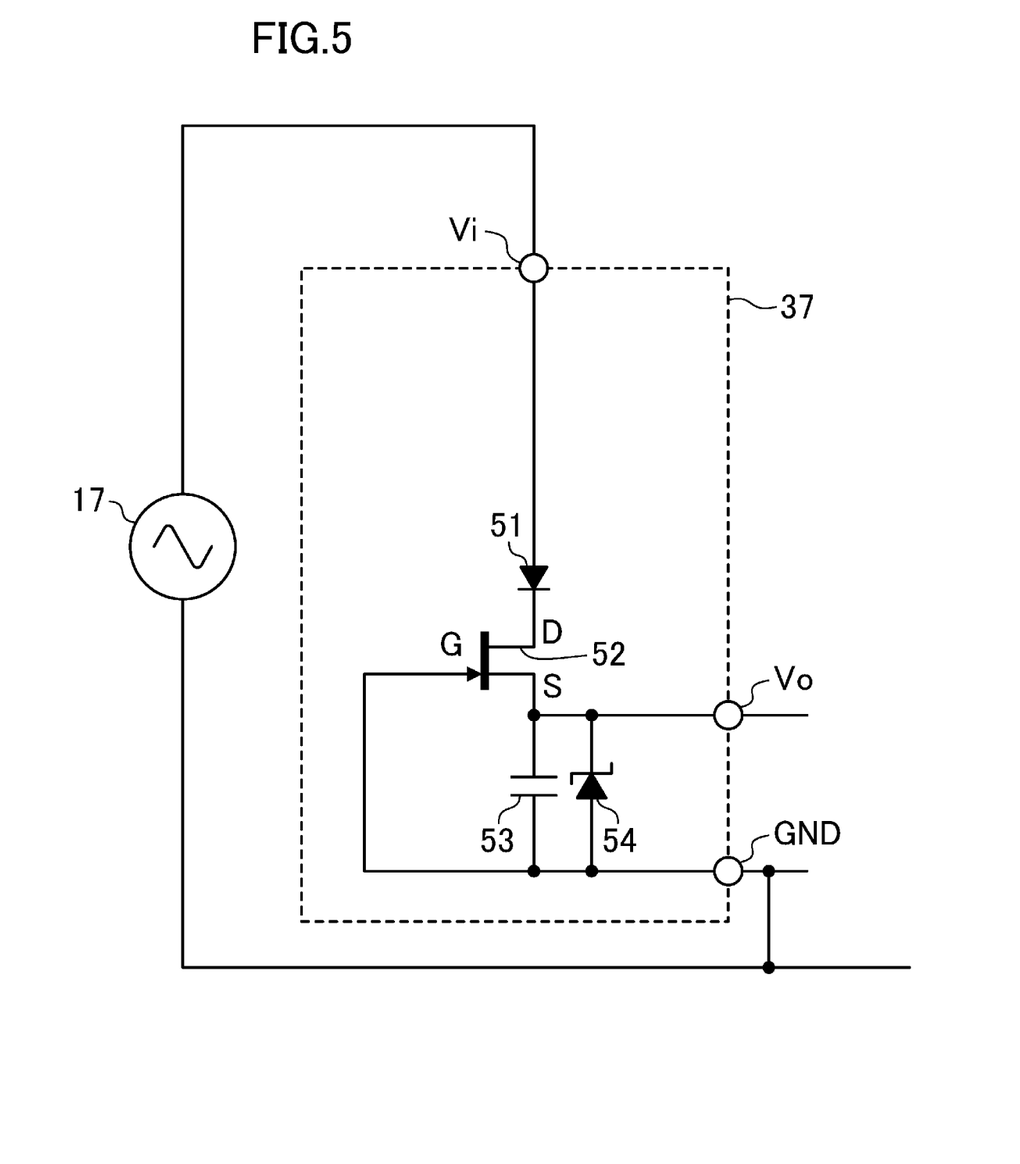
FIG. 5 is a circuit diagram illustrating a second example of the auxiliary power circuit illustrated in FIG. 3.

FIG. 5 is a circuit diagram illustrating a second example of the auxiliary power circuit 37. The auxiliary power circuit 37 of the second example includes a diode 51, a normally-on field-effect transistor (FET) 52, a capacitor 53, and a zener diode 54. The auxiliary power circuit 37 further includes a Vi terminal, a Vo terminal, and a GND terminal. The Vi terminal is connected to a drain of the normally-on FET 52 through the diode 51. A source of the normally-on FET 52 is connected to the Vo terminal. A gate of the normally-on FET 52 is connected to the GND terminal. The capacitor 53 is connected between the Vo terminal and the GND terminal. A cathode of the zener diode 54 is connected to the Vo terminal, and an anode of the zener diode 54 is connected to the GND terminal. In this example, the gate threshold voltage of the normally-on FET 52 is, e.g., −5 V.

If the potential of the Vi terminal is higher than that of the GND terminal, voltage is applied from the AC power supply 17 to the normally-on FET 52 through the Vi terminal and the diode 51. When the capacitor 53 is charged to a voltage of 5 V, the gate voltage of the normally-on FET 52 is −5 V as compared to the source voltage thereof, and therefore the normally-on FET 52 is turned off. When power is supplied from part of the auxiliary power circuit 37 between the Vo terminal and the GND terminal, and the voltage of the capacitor 53 reaches, e.g., 4 V, the gate voltage of the normally-on FET 52 is −4 V as compared to the source voltage thereof. Thus, the normally-on FET 52 is turned on, and the AC power supply 17 charges the capacitor 53 through the diode 51. When the voltage of the capacitor 53 reaches 5 V by charging, the normally-on FET 52 is turned off again.

If the potential of the Vi terminal is lower than that of the GND terminal, voltage between the Vi terminal and the GND terminal is supported by the diode 51 such that high reverse voltage is not applied to the normally-on FET 52 and the capacitor 53.

According to such a configuration, power can be supplied from the AC power supply 17 to the gate bias power supply 23. As long as desired output voltage is obtained, a diode may be, instead of the zener diode 54, provided such that reverse voltage is not applied to the capacitor 53.

In order to adjust the output voltage of the auxiliary power circuit 37, a zener diode may be inserted between the gate of the normally-on FET 52 and the GND terminal.

Figure 6:
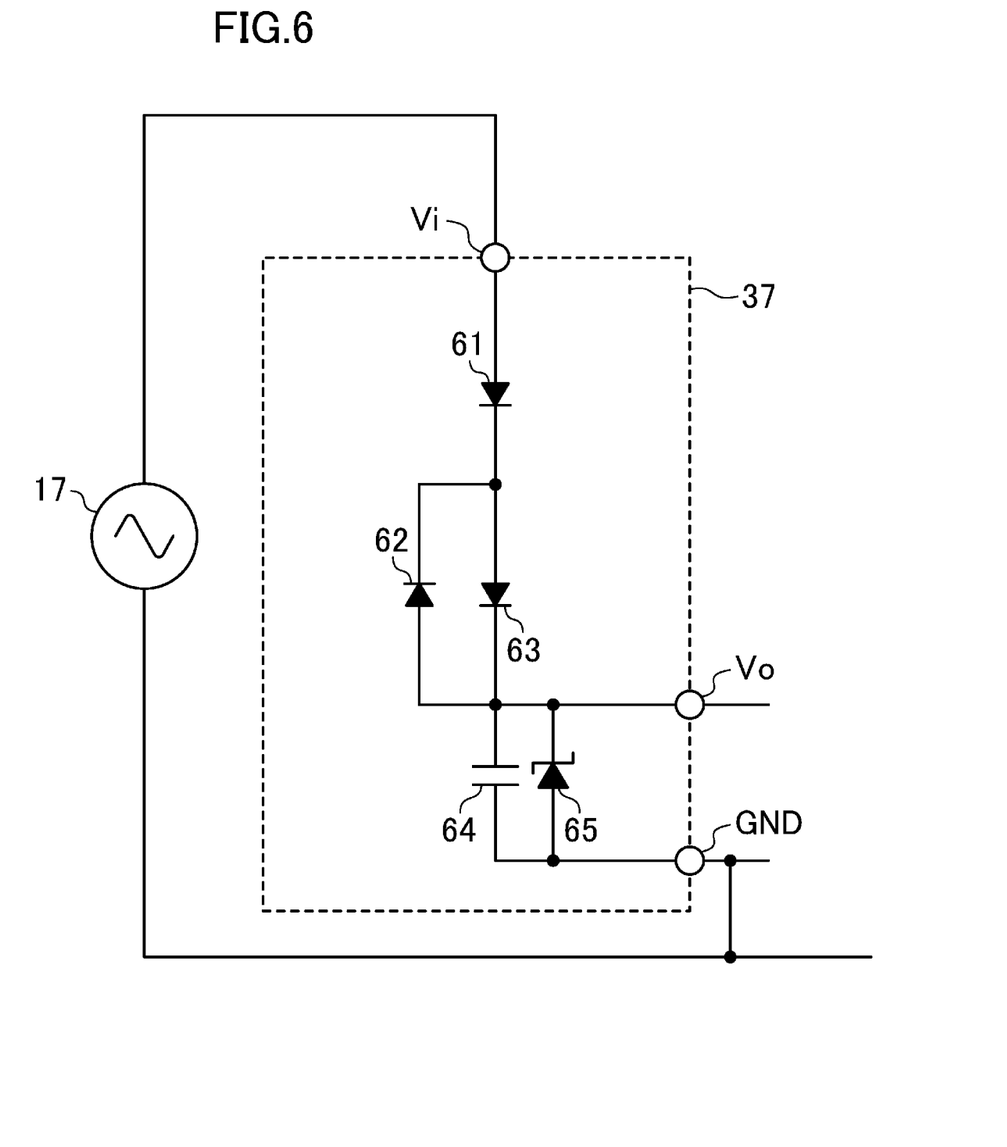
FIG. 6 is a circuit diagram illustrating a third example of the auxiliary power circuit illustrated in FIG. 3.

FIG. 6 is a circuit diagram illustrating a third example of the auxiliary power circuit 37. The auxiliary power circuit 37 of the third example includes a first diode 61, a second diode 62, a lambda diode 63, a capacitor 64, and a zener diode 65. The auxiliary power circuit 37 further includes a Vi terminal, a Vo terminal, and a GND terminal An anode of the first diode 61 is connected to the Vi terminal, and a cathode of the first diode 61 is connected to an anode of the lambda diode 63. A cathode of the lambda diode 63 is connected to the Vo terminal. One of terminals of the capacitor 64 is connected to the Vo terminal, and the other terminal of the capacitor 64 is connected to the GND terminal. A cathode of the zener diode 65 is connected to the Vo terminal, and an anode of the zener diode 65 is connected to the GND terminal. A cathode of the second diode 62 is connected to the anode of the lambda diode 63, and an anode of the second diode 62 is connected to the cathode of the lambda diode 63.

Figure 7:
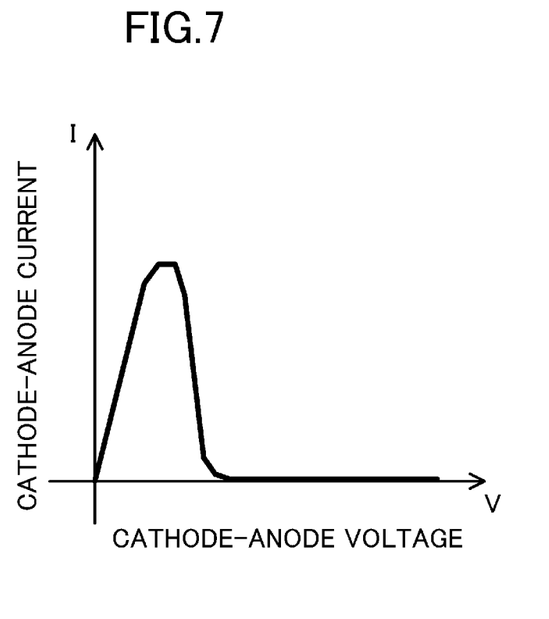
FIG. 7 is a graph illustrating current-voltage characteristics of a lambda diode illustrated in FIG. 6.

FIG. 7 illustrates current-voltage characteristics of the lambda diode 63. The lambda diode 63 has such characteristics that the lambda diode 63 causes current to flow at low applied voltage and interrupts current at high applied voltage.

According to the foregoing configuration, if the potential of the Vi terminal is higher than that of the GND terminal, voltage is applied from the AC power supply 17 to the lambda diode 63 through the Vi terminal and the first diode 61. Suppose that the voltage applied to the lambda diode 63 is, e.g., about 1-2 V. Since the lambda diode 63 is turned on, the capacitor 64 can be charged with power of the AC power supply 17. When the voltage of the AC power supply 17 increases such that the voltage applied to the lambda diode 63 reaches, e.g., about 10 V, the lambda diode 63 is in such a cutoff state that current does not flow. Since the voltage of the AC power supply 17 reaches, twice per cycle thereof, the voltage at which the lambda diode 63 is turned on, the capacitor 64 can be charged by the AC power supply 17 at such timing.

If the potential of the Vi terminal is lower than that of the GND terminal, voltage between the Vi terminal and the GND terminal is supported by the first diode 61, and the second diode 62 is connected in reverse parallel to the lambda diode 63. Thus, high reverse voltage is prevented from being applied to the lambda diode 63, and therefore damage is prevented. The second diode 62 is not necessarily used within such a voltage range that the lambda diode 63 is not damaged.

In the embodiment illustrated in FIG. 3, power for the first and second gate bias power supplies 23 and 24 may be generated in the first auxiliary power circuit 37 and the second auxiliary power circuit 38 without providing the first winding 18, the second winding 19, the third diode 33, the fourth diode 34, the second capacitor 35, and the third capacitor 36.

According to the foregoing configuration, the normally-off bidirectional switch 20 can be used to form the power conversion device, and safety of the power conversion device can be further enhanced.

Third Embodiment

Figure 8:
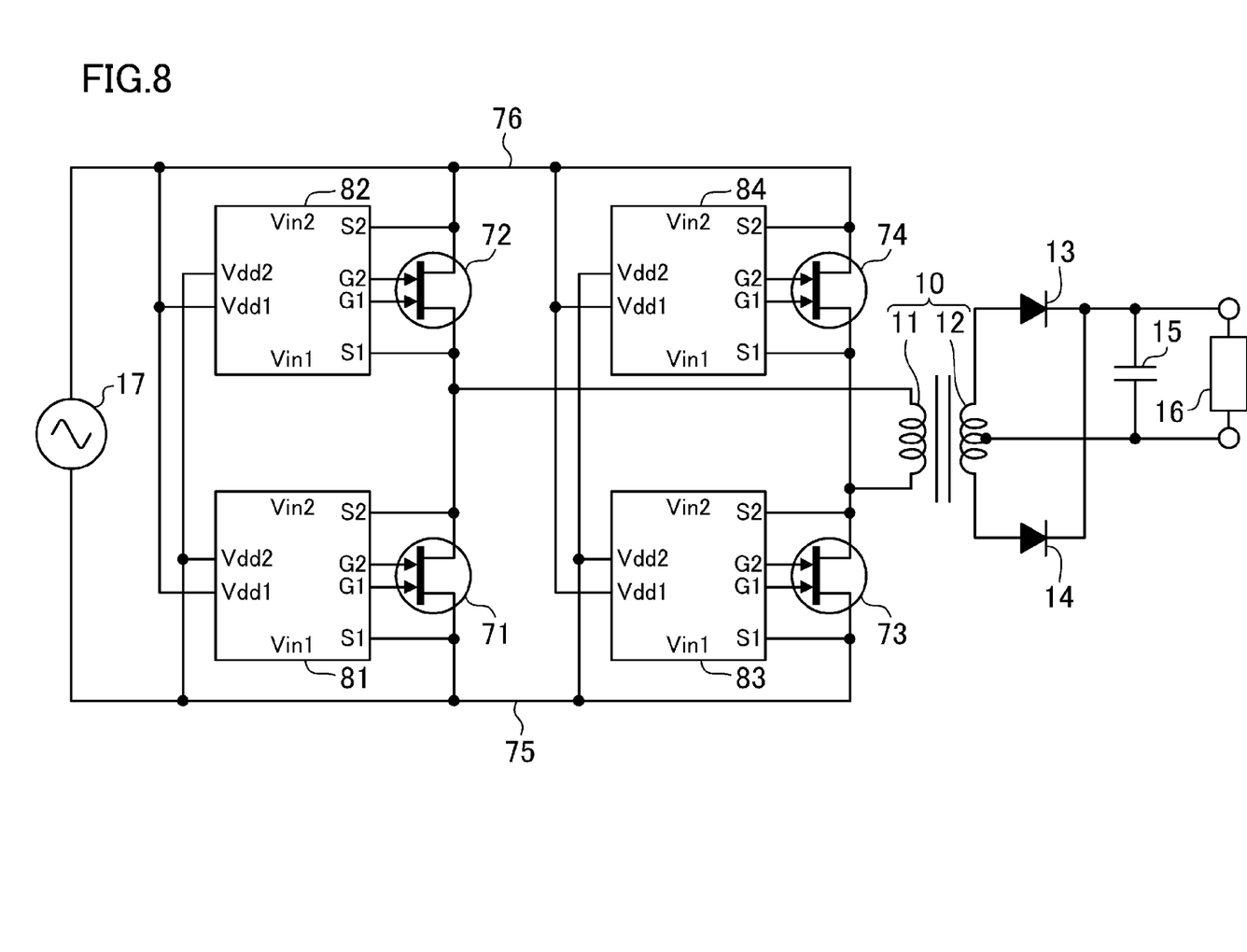
FIG. 8 is a circuit diagram illustrating a configuration of a power conversion device of a third embodiment of the present disclosure.

FIG. 8 is a circuit diagram of a power conversion device of a third embodiment. The power conversion device illustrated in FIG. 8 includes first, second, third, and fourth bidirectional switches 71, 72, 73, and 74 each having two gates as described in the first and second embodiments, a transformer 10, a first diode 13, a second diode 14, a capacitor 15, a first controller 81 connected to the first bidirectional switch 71, a second controller 82 connected to the second bidirectional switch 72, a third controller 83 connected to the third bidirectional switch 73, and a fourth controller 84 connected to the fourth bidirectional switch 74.

In the power conversion device of the present embodiment, a circuit in which the first bidirectional switch 71 and the second bidirectional switch 72 are connected together in series and a circuit in which the third bidirectional switch 73 and the fourth bidirectional switch 74 are connected together in series are connected together in parallel. An AC power supply 17 is connected to the first bidirectional switch 71 and the third bidirectional switch 73 through a first AC bus line 75, and is connected to the second bidirectional switch 72 and the fourth bidirectional switch 74 through a second AC bus line 76. One of terminals of a first winding 11 of the transformer 10 is connected to a connection point between the first bidirectional switch 71 and the second bidirectional switch 72, and the other terminal of the first winding 11 is connected to a connection point between the third bidirectional switch 73 and the fourth bidirectional switch 74.

A second winding 12 of the transformer 10 has three terminals. A first one of the terminals of the second winding 12 is connected to an anode of the first diode 13, and a second one of the terminals of the second winding 12 is connected to an anode of the second diode 14. A third one of the terminals of the second winding 12 at a middle tap thereof is connected to one of terminals of the capacitor 15 and a load 16. The other terminal of the capacitor 15 is connected to a cathode of the first diode 13, a cathode of the second diode 14, and the load 16.

A Vdd1 terminal of the first controller 81, a Vdd1 terminal of the second controller 82, a Vdd1 terminal of the third controller 83, and a Vdd1 terminal of the fourth controller 84 are connected to the second AC bus line 76. Moreover, a Vdd2 terminal of the first controller 81, a Vdd2 terminal of the second controller 82, a Vdd2 terminal of the third controller 83, and a Vdd2 terminal of the fourth controller 84 are connected to the first AC bus line 75.

Figure 9:
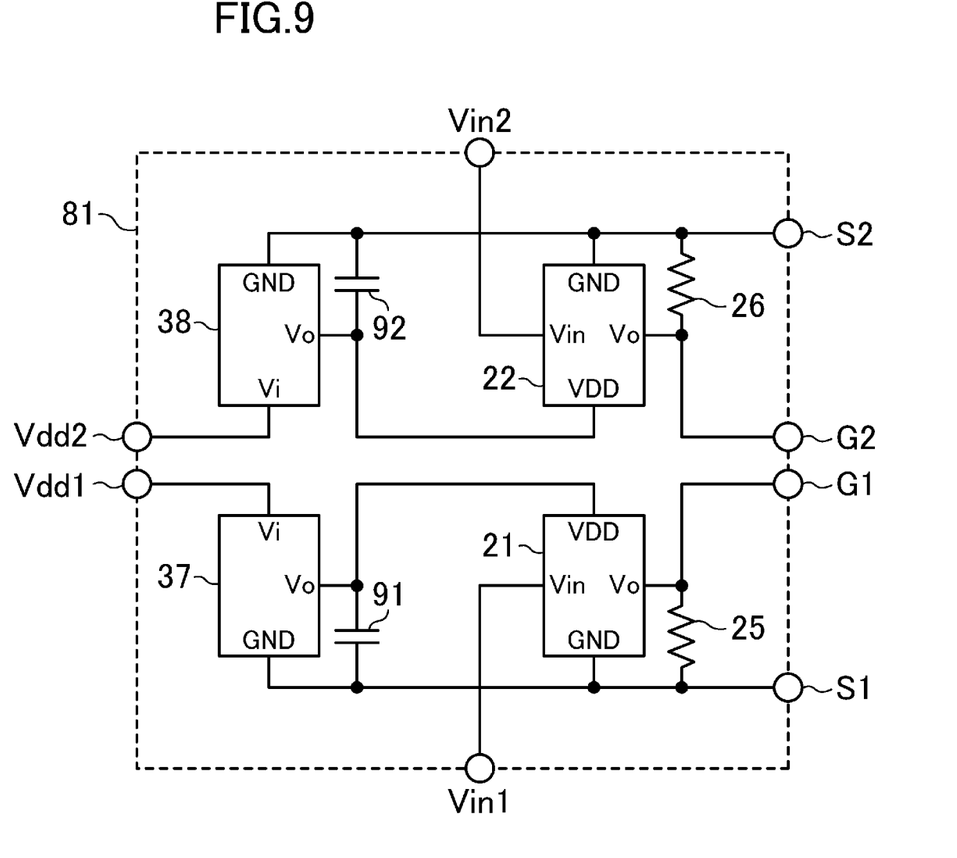
FIG. 9 is a circuit diagram illustrating an example of a controller illustrated in FIG. 8.

FIG. 9 illustrates a configuration example of the controllers 81-84 used in the present embodiment. The controller 81 includes an S1 terminal, an S2 terminal, a G1 terminal, a G2 terminal, a Vin1 terminal, a Vin2 terminal, the Vdd1 terminal, and the Vdd2 terminal. The controller 81 further includes a first gate circuit 21, a second gate circuit 22, a first resistor 25, a second resistor 26, a first capacitor 91, a second capacitor 92, a first auxiliary power circuit 37, and a second auxiliary power circuit 38. The first and second gate circuits 21 and 22 and the first and second auxiliary power circuits 37 and 38 are the same as those described in the first and second embodiments.

In the controller 81 illustrated in FIG. 9, a Vo terminal of the first gate circuit 21 and the G1 terminal are connected together. A GND terminal of the first gate circuit 21 and the S1 terminal are connected together. A Vin terminal of the first gate circuit 21 is connected to the Vin1 terminal, and a VDD terminal of the first gate circuit 21 is connected to a Vo terminal of the first auxiliary power circuit 37. One of terminals of the first resistor 25 is connected to the G1 terminal, and the other terminal of the first resistor 25 is connected to the S1 terminal. One of terminals of the first capacitor 91 is connected to the VDD terminal of the first gate circuit 21, and the other terminal of the first capacitor 91 is connected to the GND terminal of the first gate circuit 21. A GND terminal of the first auxiliary power circuit 37 is connected to the S1 terminal, and a Vi terminal of the first auxiliary power circuit 37 is connected to the Vdd1 terminal.

A Vo terminal of the second gate circuit 22 and the G2 terminal are connected together. A GND terminal of the second gate circuit 22 is connected to the S2 terminal. A Vin terminal of the second gate circuit 22 is connected to the Vin2 terminal. A VDD terminal of the second gate circuit 22 is connected to a Vo terminal of the second auxiliary power circuit 38. One of terminals of the second resistor 26 is connected to the G2 terminal, and the other terminal of the second resistor 26 is connected to the S2 terminal. One of terminals of the second capacitor 92 is connected to the VDD terminal of the second gate circuit 22, and the other terminal of the second capacitor 92 is connected to the GND terminal of the second gate circuit 22. A GND terminal of the second auxiliary power circuit 38 is connected to the S2 terminal, and a Vi terminal of the second auxiliary power circuit 38 is connected to the Vdd2 terminal.

According to the foregoing configuration, AC power can be converted into DC power through the transformer 10 in such a manner that power for the gate bias power supply is generated from the AC power supply 17 and the first to fourth bidirectional switches 71-74 are controlled by control signals from the outside, i.e., signals transmitted to the Vin1 terminals and the Vin2 terminals.

In the present embodiment, control signals are input to the Vin1 terminal and the Vin2 terminal of each of the first to fourth controllers 81-84. A High signal is input to the Vin1 terminal to apply a voltage of equal to or higher than a gate threshold voltage to the G1 terminal of the bidirectional switch. A Low signal is input to the Vin1 terminal to apply a voltage of lower than the gate threshold voltage to the G1 terminal of the bidirectional switch. Similarly, a High signal is input to the Vin2 terminal to apply a voltage of equal to or higher than the gate threshold voltage to the G2 terminal of the bidirectional switch. Moreover, a Low signal is input to the Vin2 terminal to apply a voltage of lower than the gate threshold voltage to the G2 terminal of the bidirectional switch. If reference potential is different between a circuit configured to generate a control signal and each of the Vin1 terminal and Vin2 terminal, a control signal input to each of the Vin1 terminal and the Vin2 terminal is input through an insulating coupler, such as a photocoupler, configured to isolate a primary side and a secondary side from each other. AC power can be converted into DC power in such a manner that control signals are input to the Vin1 terminal and the Vin2 terminal of each of the first to fourth controllers 81-84 as described above.

According to the foregoing configuration, the normally-off bidirectional switches 71-74 can be used to form the power conversion device. Thus, safety of the power conversion device can be further enhanced.

An operation sequence for a control of the gates of the first to fourth bidirectional switches 71-74 may be performed at timing described in Japanese Unexamined Patent Publication No. 2009-148106.

Figure 10:
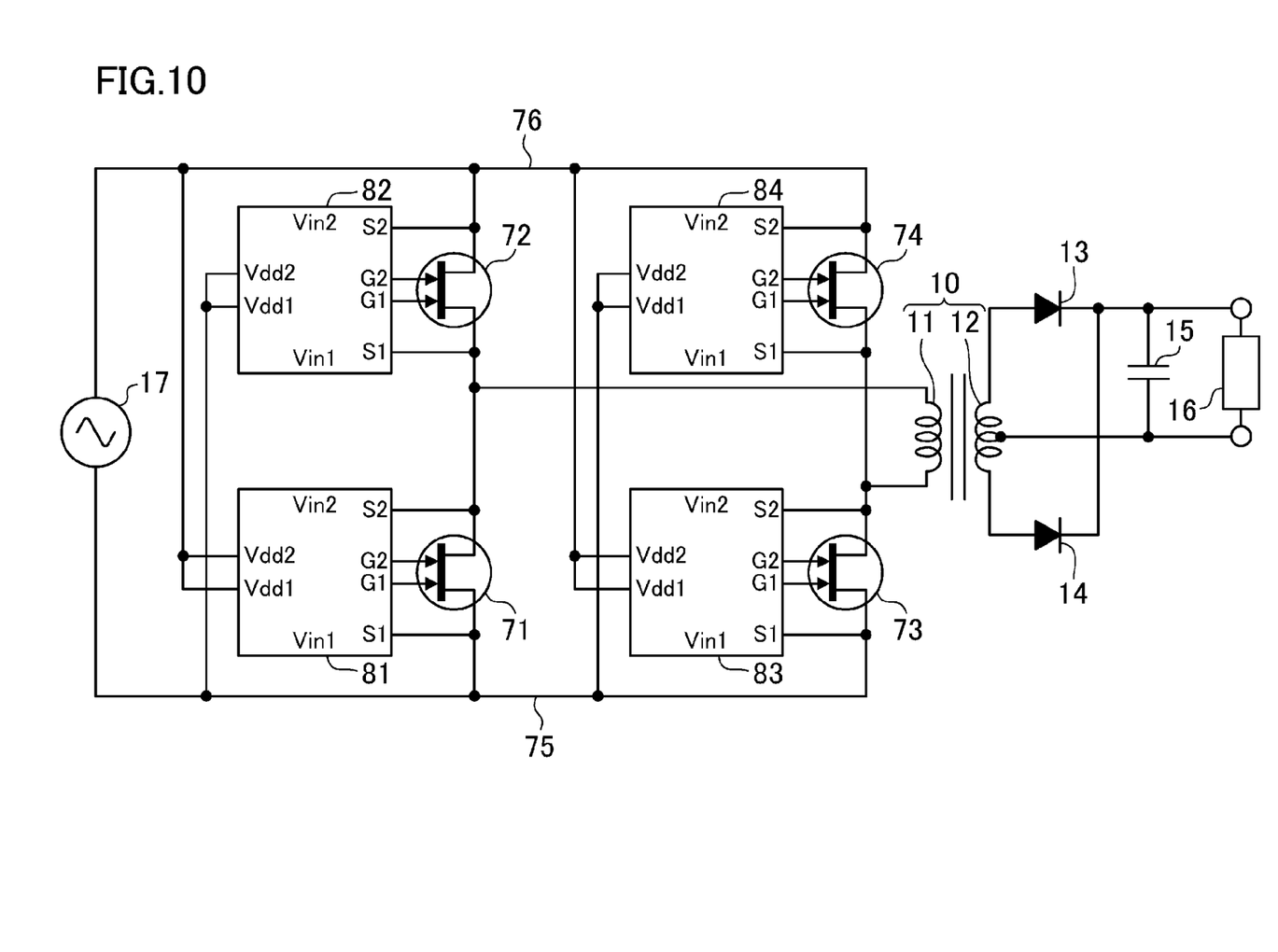
FIG. 10 is a circuit diagram illustrating a first variation of the third embodiment of the present disclosure.

FIG. 10 is a diagram illustrating a first variation of the third embodiment. FIG. 10 is different from FIG. 8 in that the Vdd1 terminal and the Vdd2 terminal of the first controller 81 and the Vdd1 terminal and the Vdd2 terminal of the third controller 83 are connected to the second AC bus line 76. Moreover, FIG. 10 is different from FIG. 8 in that the Vdd1 terminal and the Vdd2 terminal of the second controller 82 and the Vdd1 terminal and the Vdd2 terminal of the fourth controller 84 are connected to the first AC bus line 75.

According to such a configuration, AC power can be converted into DC power through the transformer 10 in such a manner that power for the gate bias power supply is generated from the AC power supply 17 and the first to fourth bidirectional switches 71-74 are controlled by control signals from the outside.

Figure 11:
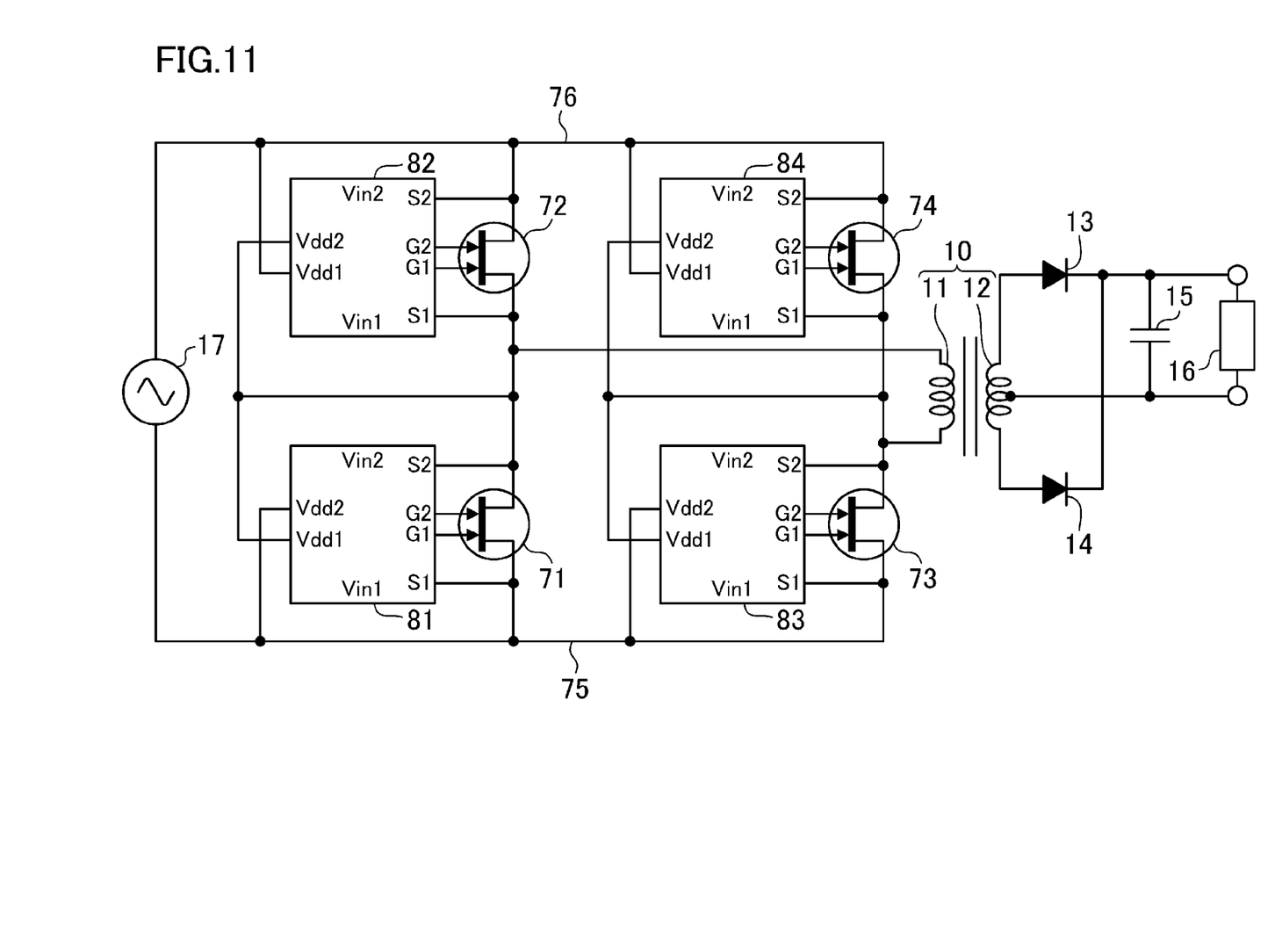
FIG. 11 is a circuit diagram illustrating a second variation of the third embodiment of the present disclosure.

FIG. 11 is a diagram illustrating a second variation of the third embodiment. FIG. 11 is different from FIG. 8 in that the Vdd1 terminal of the first controller 81 and the Vdd2 terminal of the second controller 82 are connected to the connection point between the first bidirectional switch 71 and the second bidirectional switch 72, that the Vdd1 terminal of the third controller 83 and the Vdd2 terminal of the fourth controller 84 are connected to the connection point between the third bidirectional switch 73 and the fourth bidirectional switch 74, that the Vdd2 terminal of the first controller 81 and the Vdd2 terminal of the third controller 83 are connected to the first AC bus line 75, and that the Vdd1 terminal of the second controller 82 and the Vdd1 terminal of the fourth controller 84 are connected to the second AC bus line 76.

According to such a configuration, AC power can be converted into DC power through the transformer 10 in such a manner that power for the gate bias power supply is generated from the AC power supply 17 and the first to fourth bidirectional switches 71-74 are controlled by control signals from the outside.

The capacitors 46, 53, and 64 in the foregoing auxiliary power circuit 37 may also serve as each of the first and second capacitors 91 and 92 connected to a corresponding one of the Vo terminals of the first and second auxiliary power circuits 37 and 38 in the third embodiment.

In the first to third embodiments, e.g., a bidirectional switch using two insulated gate bipolar transistors (IGBTs) and two diodes, a bidirectional switch in which two IGBTs each capable of interrupting reverse current are connected in reverse parallel, or a bidirectional switch in which two metal-oxide-semiconductor field-effect transistors (MOSFETs) are connected together in series may be used as each of the bidirectional switches 20 and 71-74. Alternatively, a dual gate MOSFET including two gates may be used.

In the first to third embodiments, the example where the first diode 13, the second diode 14, and the capacitor 15 are connected to the second winding 12 of the transformer 10 to convert AC power generated in the second winding 12 into DC power has been described. However, AC power generated at the second winding 12 may be used as it is.

In combination with a double gate bidirectional switch including a p-type gate as described in International Patent Publication No. WO 2008/062800, the efficiency of the power conversion device can be further increased, as well as further reducing the size of the power conversion device. In the bidirectional switch using the p-type gate as described in International Patent Publication No. WO 2008/062800, holes are injected through the gate to cause conductivity modulation in a channel. As a result, drive current can be increased, and on-resistance can be reduced. Thus, such a bidirectional switch is used to form the power conversion device, thereby reducing a conduction loss due to on-resistance. Moreover, as compared to a power conversion device including a bidirectional switch such as a conventional insulated gate device, the size of the power conversion device can be reduced with higher efficiency thereof.

In order to cause the conductivity modulation in the bidirectional switch including the p-type gate, larger gate current is, as compared to the insulated gate device, required for maintaining an ON-state of the bidirectional switch. A conventionally-known gate power supply circuit is configured such that, e.g., a light emitting diode is used to convert electric energy into another type of energy such as light and then a solar cell is used to re-convert the energy into electric energy to generate gate power. In such a case, since the energy is converted into another type of energy once, conversion efficiency is low, and only a power of about several μW can be obtained. Such power is sufficient for driving the insulated gate device, but is insufficient for driving the bidirectional switch including the p-type gate. Although an insulated DC/DC converter including a transformer may be used, it is difficult to reduce the size of the transformer, and the size of the power conversion device is increased.

On the other hand, the gate power supply circuit described in the first to third embodiments does not convert electric energy directly into light energy, but generates gate power by direct power conversion. Thus, gate power required for driving the bidirectional switch including the p-type gate can be ensured with the reduced size of the gate power supply circuit. Moreover, since the resistors and the semiconductor elements mainly form the gate power supply circuit, the gate power supply circuit can be integrated. The present disclosure and the bidirectional switch including the p-type gate as described in International Patent Publication No. WO 2008/062800 allow further reduction in size of the power conversion device.

As described above, the power conversion device of the present disclosure is a power conversion device using a normally-off bidirectional switch and provided with higher safety and higher efficiency, and is useful as, e.g., an AC/DC power supply.

What is claimed is:

1. A power conversion device comprising:
   a transformer;
   a first normally-off bidirectional switch including two gates and connected to the transformer;
   a first controller configured to control the first normally-off bidirectional switch; and
   a gate power supply circuit configured to generate power to be supplied from an AC power supply to the gates of the first normally-off bidirectional switch.

2. The power conversion device of claim 1, wherein
   the transformer includes a first winding and a second winding, and
   the gate power supply circuit includes
      a first gate bias power supply configured to use power generated at the first winding to supply power for driving one of the gates of the first normally-off bidirectional switch, and
      a second gate bias power supply configured to use power generated at the second winding to supply power for driving the other gate of the first normally-off bidirectional switch.

3. The power conversion device of claim 1, wherein
   the gate power supply circuit includes a regulator.

4. The power conversion device of claim 1, wherein
   the gate power supply circuit includes a normally-on transistor.

5. The power conversion device of claim 1, wherein
   the gate power supply circuit includes a lambda diode.

6. The power conversion device of claim 1, further comprising:
   a second normally-off bidirectional switch;
   a second controller configured to control the second normally-off bidirectional switch;
   a third normally-off bidirectional switch;
   a third controller configured to control the third normally-off bidirectional switch;
   a fourth normally-off bidirectional switch; and
   a fourth controller configured to control the fourth normally-off bidirectional switch.

7. The power conversion device of claim 1, wherein
   the first normally-off bidirectional switch includes a p-type gate.

8. The power conversion device of claim 1, wherein
   a first resistor is connected between a first source electrode and a first gate electrode of the first normally-off bidirectional switch, and a second resistor is connected between a second source electrode and a second gate electrode of the first normally-off bidirectional switch.

* * * * *